US008352827B2

United States Patent
Gong et al.

(10) Patent No.: US 8,352,827 B2
(45) Date of Patent: Jan. 8, 2013

(54) LDPC HARD DECISION DECODER FOR HIGH-SPEED WIRELESS DATA COMMUNICATIONS

(75) Inventors: Chen Gong, New York, NY (US); Guosen Yue, Plainsboro, NJ (US); Xiadong Wang, New York, NY (US)

(73) Assignee: NEC Laboratories America, Inc., Princeton, NJ (US)

( * ) Notice: Subject to any disclaimer, the term of this patent is extended or adjusted under 35 U.S.C. 154(b) by 385 days.

(21) Appl. No.: 12/823,400

(22) Filed: Jun. 25, 2010

(65) Prior Publication Data

US 2011/0010600 A1    Jan. 13, 2011

Related U.S. Application Data

(60) Provisional application No. 61/220,308, filed on Jun. 25, 2009.

(51) Int. Cl.
    *H03M 13/00*    (2006.01)
    *H03M 13/03*    (2006.01)
(52) U.S. Cl. ......... 714/752; 714/758; 714/786; 714/792
(58) Field of Classification Search .................. 714/752, 714/758, 786, 792
    See application file for complete search history.

(56) References Cited

U.S. PATENT DOCUMENTS

| 7,246,297 B2 * | 7/2007 | Zarrinkhat et al. ........... 714/755 |
| 8,140,948 B2 * | 3/2012 | Yue et al. ...................... 714/792 |
| 2008/0052594 A1 * | 2/2008 | Yedidia et al. ................ 714/758 |

OTHER PUBLICATIONS namely Yue et al., A New Binary Iterative LDPC Decoding Algorithm, 2008, IEEE, pp. 139-144.*
Zarrinkhat et al. Hybrid Hard-Decision Iterative Decoding of Irregular Low-Density Parity-Check Codes, Feb. 2007, IEEE, vol. 55, No. 2, pp. 2925-302.*
Varshney, Performance of LDPC Codes Under Faulty Iterative Decoding, Sep. 2007, Information Theory Workshop, pp. 1-25.*

* cited by examiner

*Primary Examiner* — John J Tabone, Jr.
(74) *Attorney, Agent, or Firm* — Joseph Kolodka

(57) ABSTRACT

A method for low-density parity-check hard decision decoding includes computing, for every decoding iteration, a discrepancy of extrinsic messages responsive to channel inputs of a receiver, performing a flipping of the channel inputs responsive to a comparison of the discrepancy of extrinsic messages to a flipping threshold, the flipping threshold for each decoding iteration being determined based on a threshold computation responsive to a channel error probability estimation in a first iteration of a decoding of the channel inputs, and check node decoding responsive to the flipping of channel inputs.

11 Claims, 3 Drawing Sheets

LDPC HARD DECISION DECODER FOR HIGH-SPEED WIRELESS DATA COMMUNICATIONS

CROSS-REFERENCE TO RELATED APPLICATIONS

This application claims the benefit of U.S. Provisional Application No. 61/220,308 filed on Jun. 25, 2009, the contents of which is hereby incorporated by reference.

BACKGROUND OF THE INVENTION

The invention relates to data communication, and, more particularly, to a low-density parity-check (LDPC) hard decision decoder for high speed wireless data communications.

Recently, high-order modulation formats, such as M-PSK and M-QAM (quadrature amplitude modulation), have been proposed for optical transmission systems to obtain higher spectral efficiency. Moreover, coherent systems are gaining interest due to the availability of high-speed signal processing and low-priced components, as well as the partly relaxed receiver requirements at high data rates. Coherent receivers can exploit all optical field parameters (amplitude, phase, frequency and polarization) in the electrical domain and permit to reach the ultimate limits of spectral efficiency. On the other hand, recent works have also considered applications of turbo and LDPC codes to optical communications. These codes offer capacity approaching performance when the codeword length is very large.

The very-high information rate that needs to be sustained by the emerging optical transmission systems, e.g., 40-100 Gb/s, poses a severe complexity constraint on the decoder. The soft decoding techniques that are traditionally associated with turbo or LDPC codes may be too complex for such systems. LDPC hard decoding methods include the majority-based (MB) time-invariant decoding algorithms, the probabilistic flipping algorithms and several switch-type hybrid algorithms. On the other hand, although a Gallager decoding method B (GB) is optimal for decoding infinite-length codes, it suffers performance degradation when decoding finite-length codes. Expanded optimal switch algorithms for regular codes have been proposed, which provide significant performance improvement over GB. However, for irregular codes, the existing hard decoding algorithms require the degree information of variable nodes. Such requirement significantly increases the circuit level implementation complexity due to the operations of storing and retrieving the degree information.

Accordingly, there is a need for an efficient low complexity decoding of finite-length irregular LDPC codes for ultra-high speed communications.

SUMMARY OF INVENTION

A method for low-density parity-check hard decision decoding includes computing, for every decoding iteration, a discrepancy of extrinsic messages responsive to channel inputs of a receiver, performing a flipping of the channel inputs responsive to a comparison of the discrepancy of extrinsic messages to a flipping threshold, the flipping threshold for each decoding iteration being determined based on a threshold computation responsive to a channel error probability estimation in a first iteration of a decoding of the channel inputs, and check node decoding responsive to the flipping of channel inputs.

These and other advantages of the invention will be apparent to those of ordinary skill in the art by reference to the following detailed description and the accompanying drawings.

DETAILED DESCRIPTION

The present invention is directed to an efficient switch type hard-decision decoder that does not require degree information of variable nodes. It is a low complexity and low cost decoder with the channel error probability estimated only in the first iteration of the decoding without estimation of error probability of the extrinsic messages in each iteration. The present decoder also does not require the prior information about the channel error probability since the channel error probability can be estimated by the decoder.

Low-Complexity Hard-Decision Decoder for Finite-Length Irregular LDPC Codes

Figure 1:
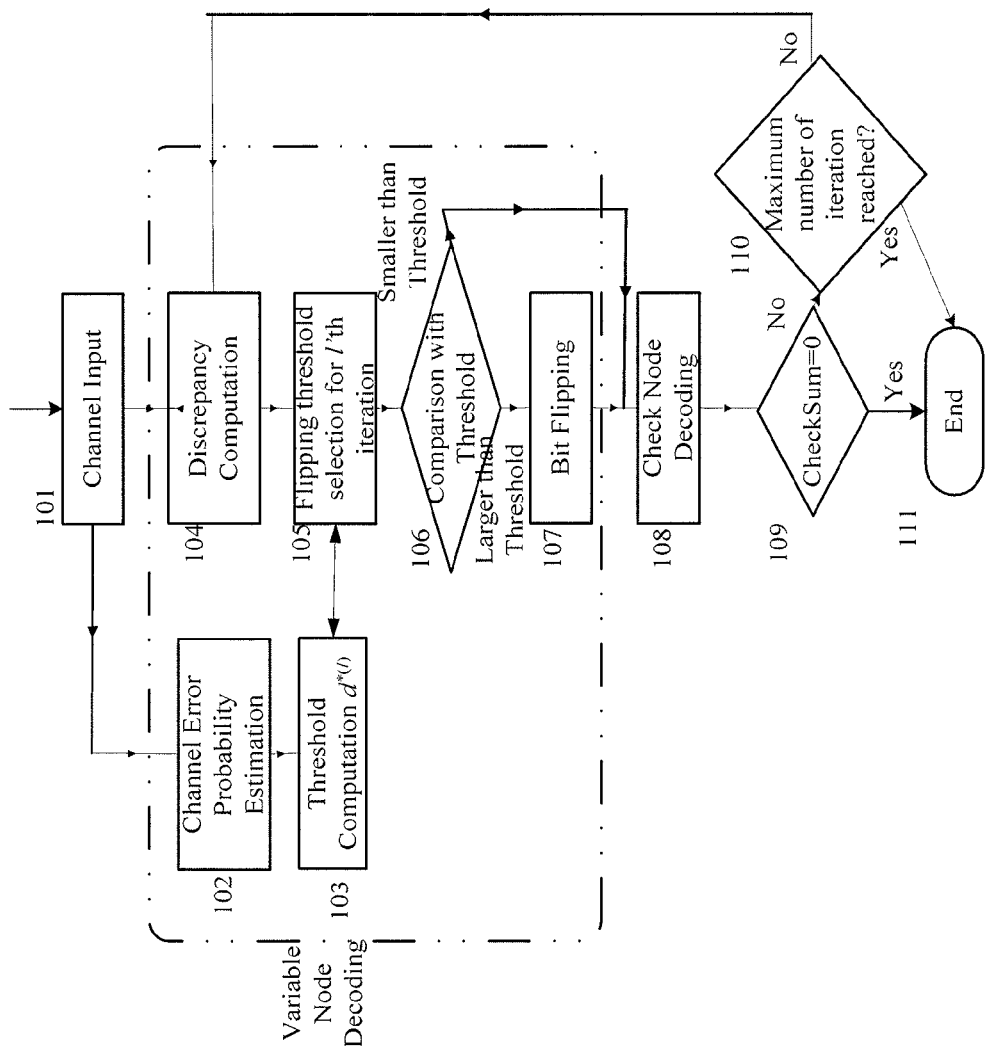
FIG. 1 is a block diagram of an efficient LDPC hard decision decoder, in accordance with the invention.

The block diagram of FIG. 1 illustrates the efficient hard-decision decoding for finite-length irregular LDPC codes, in accordance with the invention. Responsive to a channel input 101, the discrepancy of the extrinsic messages is computed 104 for each decoding iteration. The system then performs the bit flipping 107 according to comparison results between the discrepancy and the flipping threshold, which is denoted as 104, 106. The channel error probability is first estimated 102. Then, based on the pre-computed flipping threshold 103, the flipping threshold is selected for each iteration 105 for variable node decoding.

We assume the binary messages belong to $\{+1,-1\}$. The check nodes decoding (108) is the same as for a Gallager decoding method B (GB) decoder, given by $$u_{c \to v,k}^{(l)} = \prod_{l \in \mathcal{U}_m, l \neq k} v_{v \to c, l}^{(l)}, \quad k \in \mathcal{U}_m, \quad m = 1, \ldots M. \tag{1}$$

where $v_{c \to v,j}^{(l)}$ and $u_{c \to v,j}^{(l)}$ are the input and output extrinsic messages for the check nodes. With the channel input (101), we compute the discrepancy (104) as the metric for the bit flipping at the variable nodes, given by $$m_k^{(l)} = -u_n \sum_{j \in v_n, j \neq k} u_{c \to v,j}^{(l)}, \quad k \in v_n \tag{2}$$

We then compare the discrepancy with the flipping thresholds (106), and flip the channel inputs if the discrepancy is larger than the threshold (107). Specifically, the bit flipping is given by $$v_{v \to c,k}^{(\ell|1)} = \begin{cases} -u_n & \text{if } m_k^{(\ell)} \geq d^{(\ell)}, \\ u_n, & \text{otherwise,} \end{cases} \quad (3)$$

where $d^{(\ell)}$ is the flipping threshold that is same for all variable nodes. The key point here is that the metric does not need the degree information of variable nodes in the decoding process, and thus can reduce the complexity of hardware implementations. Following the bit flipping 107, a check node decoding 108 leads to a CheckSum 109 step tied to a maximum iterations count check 110 till the decoding iteration ends 111.

The computation of optimal flipping threshold is based on the crossover channel error probability. In the inventive decoder, we estimate the channel probability in the first iteration of the decoding (102), and compute the optimal flipping threshold for infinite-length codes based on the estimated error probability (103). For decoding finite-length codes, we select the flipping threshold (105) based on the pre-computed flipping thresholds employing the K-exp-OSS or L-add-OSS method, as shown in FIG. 1.

Figure 2:
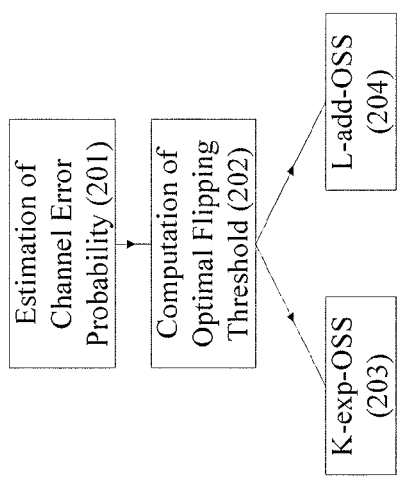
FIG. 2 is a block diagram of flipping threshold computations for the inventive decoder of FIG. 1.

FIG. 2 illustrates the details of the channel error probability estimation and flipping threshold computation, in accordance with the invention.

Let $\{\hat{p}_i\}$ denote the check profile from the node perspective. The estimated channel error probability 201, denoted as $\hat{p}_c$, is given by the following equation $$\frac{1 - \sum_i \tilde{p}_i (1 - 2\hat{p}_c)^i}{2} = \frac{M_e}{M}, \quad (4)$$

where $M_e$ is the number of unsatisfied check relations in the first decoding iteration.

The optimal flipping threshold, 202, denoted as $d^{(l+1)}$ in the l+1th iteration is the smallest d satisfying the following equation $$\frac{1 - \hat{p}_c}{\hat{p}_c} \leq \left( \frac{1 + \rho(1 - p^{(l)})}{1 - \rho(1 - p^{(l)})} \right)^d, \quad (5)$$

where $\rho(x) = \sum_i \rho_i x^{i-1}(\{\rho_i\}$ is the check node profile from the edge perspective), and $p^{(l)}$ is the error probability of traversing messages in the l-th iteration. Given the estimated channel error probability $\hat{p}_c$ and degree profiles of the LDPC codes, $p^{(l)}$ can be estimated analytically.

The encoding/decoding proposes the K-exp-OSS and L-add-OSS features, 203 and 204, which significantly outperforms other techniques for finite-length codes.

a. K-exp-OSS method (203): Assume $d^{*(l)}$ be the optimal flipping threshold obtained analytically from (5). For the K-exp-OSS, the flipping threshold $d^{(l)}$ is given by $d^{(l)}= d^{*(\lfloor l/K \rfloor)}$. For example, if the optimal thresholds $(d_1, d_2, d_3 \ldots) = (5, 4, 3, \ldots )$, then the flipping thresholds for the 3-exp-OSS are given by $(d_1, d_2, d_3 \ldots ) = (5, 5, 5, 4, 4, 4, 3, 3, 3, \ldots )$. We can choose K=3.

b. L-add-OSS method (204): Suppose the first $L_1$, optimal flipping thresholds are $d_1$, the following $L_2$ are $d_2$, and the next $L_3$ are $d_3, \ldots$. Then for the L-add-OSS, the first $L_1+L$ optimal flipping thresholds are $d_1$, the following $L_2+L$ are $d_2$, and the next $L_3+L$ are $d_3, \ldots$. For example, if the optimal thresholds $(d_1, d_2, d_3 \ldots ) = (5, 4, 4, 3, \ldots )$, then the flipping thresholds for the 2-add-OSS are given by $(d_1, d_2, d_3 \ldots ) = (5, 5, 5, 4, 4, 4, 4, 3, 3, 3, \ldots )$. We can choose L=5.

Optimization of Multilevel Coding Systems Based on the Hard Decision Decoding

Figure 3:
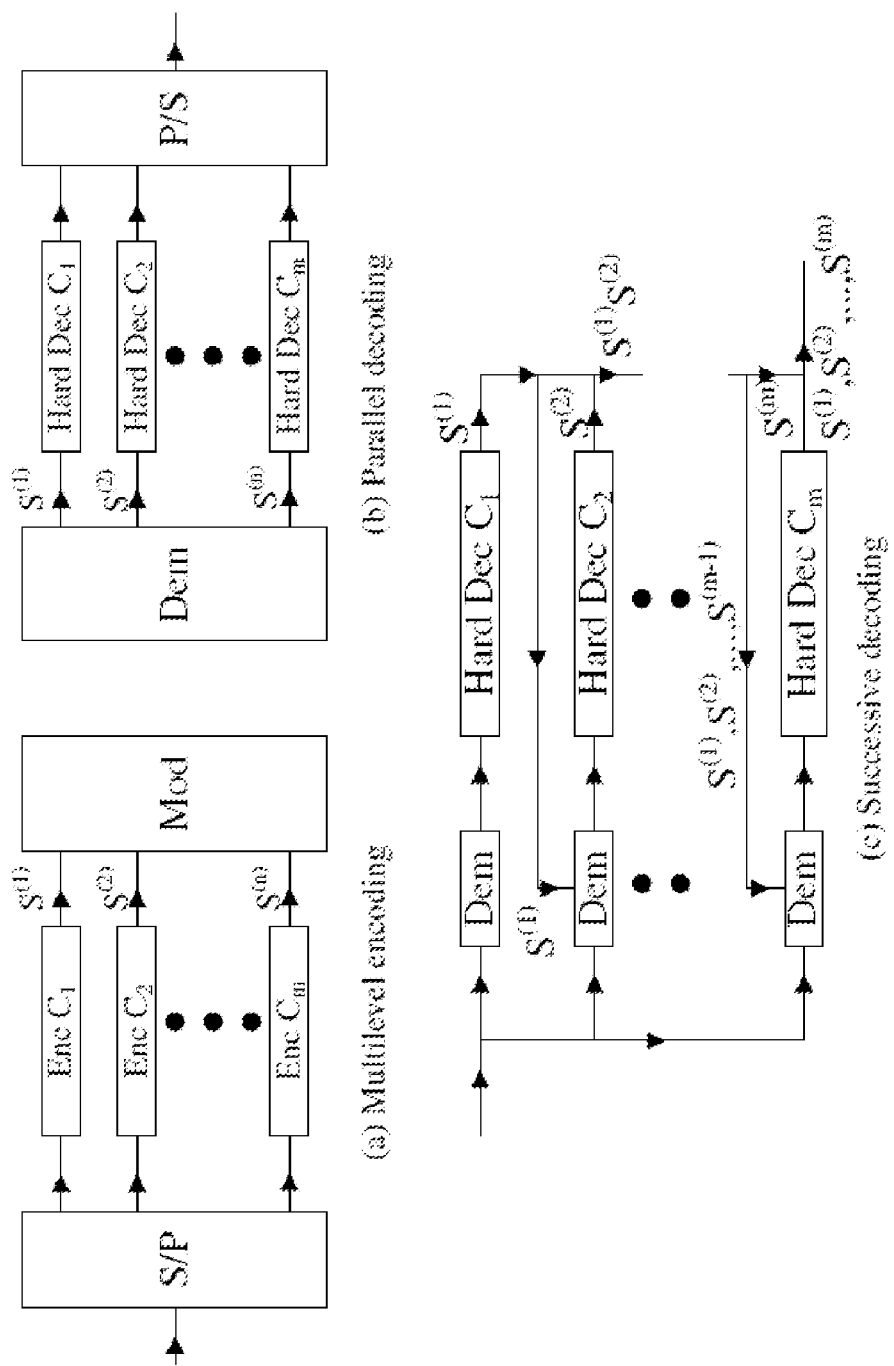
FIG. 3 is a bock diagram of multilevel coding and parallel independent decoding (PID)/multistage decoding (MSD), in accordance with the invention.

The multilevel coding scheme with PID/MSD is shown in FIG. 3. For the multilevel coding, FIG. 3(a), a serial-to-parallel S/P converter sends encoded streams Enc $C_{1 \ldots m}$ of signals $S^{(1) \cdots (m)}$ to a modulator Mod. For the parallel decoding, FIG. 3(d), the demodulator DEM sends the signals $S^{(1) \cdots (m)}$ for a hard decoding Hard Dec $C_{1 \ldots m}$ which in turn are converted into a data stream by a parallel-to-serial P/S converter. For the successive decoding, FIG. 3(c), demodulators DEM feed into hard decoders Hard Dec $C_{1 \ldots m}$ which feedback signals $S^{(1) \cdots (m)}$ through the demodulators Dem.

Referring again to FIG. 3, we partition the n mapping bits into m non-overlapping subsets, and employ different rate codes for the mapping bits in different subsets. Note that the special case of m=1 corresponds to the traditional single-level coding.

In the parallel independent decoding PID, we find the constellation signal points $\tilde{S}_k$ closest to $y_k$, de-multiplex the mapping bits of $\tilde{S}_k$ into m levels according to the set partition rule, and perform the hard-decoding for each component code simultaneously.

In the multistage decoding MSD, the decoding is performed in m stages where in the i-th stage we decode the mapping bits in $S^{(i)}$. In the first stage, we find the signal points $\tilde{S}_k^{(1)}$ closest to $y_k$, retrieve the mapping bits of $\tilde{S}_k^{(1)}$ corresponding to $S^{(l)}$, and perform the decoding of $C^{(l)}$. In the i-th stage ($2 \leq i \leq m$), we find the signal points $\tilde{S}_k^{(i)}$, subject to the constraint that the mapping bits of $\tilde{S}_k^{(i)}$ corresponding to $S^{(l)}$ to $S^{(i-1)}$ are equal to the corresponding decoded bits in the preceding i−1 stages, and perform the decoding of $C^{(l)}$.

We employ different rate component codes for PID/MSD. The rate allocation and profile design for component codes are given as follows.

The component code design includes two aspects. One is to optimize the profiles of component codes given the channel $E_s/N_0$, and the other is to allocate rates and optimize profiles for component codes given the overall code rate Given the channel $E_s/N_0$, for $1 \leq i \leq m$ we evaluate the error rates $e^{(i)}$ for $S^{(i)}$, and perform the rate optimization for the code $C^{(i)}$ by the code rate optimization. Let $R_{PID}(E_s/N_0)$ be the average rate of the component codes.

Given the overall code rate r, we design the component codes $C^{(i)}$ for $1 \leq i \leq m$ using a bisection search.

Figure 4:
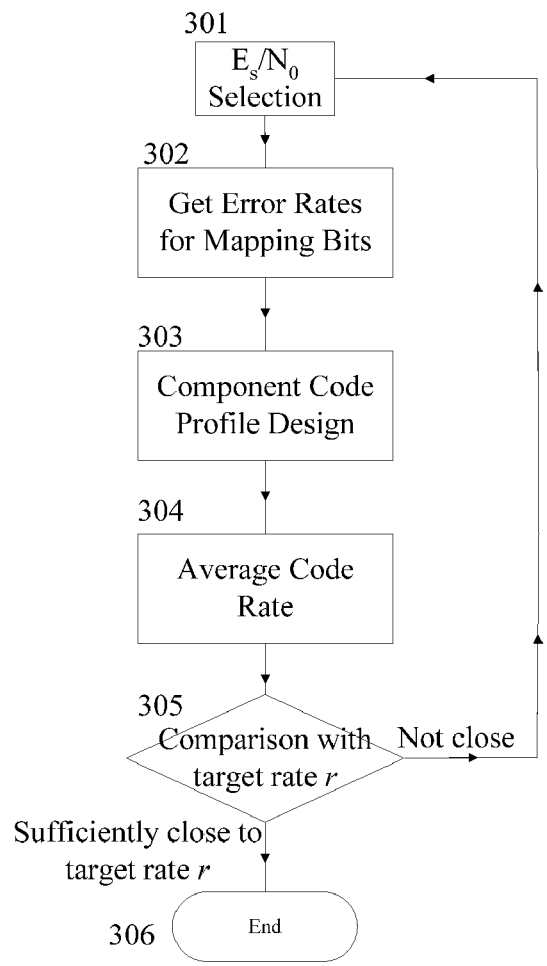
FIG. 4 is a block diagram of component code configuration for PID and MSD, in accordance with the invention.

The search starts with a $E_s/N_0$ selection (301) from a low value $(E_s/N_0)_l$, and a high value $(E_s/N_0)_h$. We let $(E_s/N_0)_m = ((E_s/N_0) + (E_s/N_0)_l)/2$, and compute the $R_{PID}((E_s/N_0)_m)$. If $R_{PID}((E_s/N_0)_m) < r$, then we update $(E_s/N_0)_l = (E_s/N_0)_m$; otherwise we update $(E_s/N_0)_h = (E_s/N_0)_m$, until $R_{PID}((E_s/N_0)_m)$ is sufficiently close to r. Assuming $(E_s/N_0)_m = (E_s/N_0)^*$ when the bisection search terminates, we output $(E_s/N_0)^*$ as the threshold and the optimized profiles of component codes for $(E_s/N_0)^*$ as the designed code profiles. The bisection search is shown in FIG. 4.

The component code design for MSD is similar to that for PID. Given $E_s/N_0$, 301, we optimize the component codes based on the code rate optimization. Given the average code rate (302) for mapping bits, we allocate the rates and optimize the profiles for component codes by a bisection search (303). The difference is that the bit error rates $e^{(i)}$ for $S^{(i)}$ (i=1, 2, ..., m) are evaluated as follows. Suppose we transmit the signal s and receive the noisy signal y. The evaluation of the bit error rate $e^{(i)}$ for $S^{(i)}$ is the same as that for PID. To evaluate the error rates $e^{(i)}$ for $S^{(i)}$ for i>2, we find the signal point closest to y in the constellation, denoted as ŝ, subject to the constraint that the mapping bits for ŝ in the subsets $S^{(j)}$ for $1 \leq j \leq i-1$ are equal to those for s. The average code rate 304 is determined and if a comparison with the target code rate r is sufficiently close then the component code design ends, otherwise the sequence code design goes back to step 301.

Figure 5:
FIG. 5 is a block diagram of an exemplary communication system employing the present low-density parity-check (LDPC) hard decision decoder, in accordance with the invention

FIG. 5 depicts a high-speed data transmission system according to an embodiment of the present invention. The system comprises a transmitter and one receiver. The transmitter is equipped with a controller for multilevel coding and one or more LDPC encoders. The receiver is equipped with a system that can be adapted to receive and/or process signals received from the transmitter. The system may also include a controller which each may be in communication with transmitter which contains a multilevel decoding and one or more LDPC decoders. The controller may be a computer software/hardware combination or an application specific integrated circuit configuration with RAM, ROM, processor, parallel and serial converters.

While an exemplary drawing and specific embodiment of the present invention has been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents.

What is claimed is:

1. A method for low-density parity-check hard decision decoding comprising the steps of:
    computing, for every decoding iteration, a discrepancy of extrinsic messages responsive to channel inputs of a receiver;
    performing a flipping of said channel inputs responsive to a comparison of said discrepancy of extrinsic messages to a flipping threshold, said flipping threshold for each said decoding iteration being determined based on a threshold computation responsive to a channel error probability estimation in a first iteration of a decoding of said channel inputs; and
    check node decoding responsive to said flipping of channel inputs.

2. The method of claim 1, wherein said bit flipping is responsive to $v_{c \rightarrow v,j}^{(l)}$ and $u_{c \rightarrow v,j}^{(l)}$, which are input and output extrinsic messages, respectively, for said check node decoding.

3. The method of claim 2, wherein $v_{c \rightarrow v,j}^{(l)}$ and $u_{c \rightarrow v,j}^{(l)}$ of said flipping of channel inputs are related according to $$v_{v \rightarrow c,k}^{(l+1)} = \begin{cases} -u_n & \text{if } m_k^{(l)} \geq d^{(l)}, \\ u_n, & \text{otherwise,} \end{cases}$$

where $d^{(l)}$ is said flipping threshold and $m_k^{(l)}$ is a metric for said discrepancy at variable nodes.

4. The method of claim 1, wherein flipping threshold comprises an optimal flipping threshold responsive to one of a K-exp-OSS and an L-add-OSS.

5. The method of claim 4, wherein said K-exp-OSS comprises assuming said flipping threshold $d^{(l)}$ is given by $d^{(l)} = d*^{(l/K)}$ and $d*^{(i)}$ to be the optimal flipping threshold obtained analytically according to $$\frac{1-\hat{p}_c}{\hat{p}_c} \leq \left( \frac{1+\rho(1-p^{(l)})}{1-\rho(1-p^{(l)})} \right)^d, \text{ where } \rho(x) = \sum_i \rho_i x^{i-1} (\{\rho_i\}$$

is a check node profile from an edge perspective), and $p^{(l)}$ is the error probability of traversing messages in the l-th decoding iteration, which can be analytically computed based on an estimated channel error probability $\hat{p}_c$ and degree profiles of LDPC codes, and $p^{(l)}$ being estimated analytically.

6. The method of claim 4, wherein said L-add-OSS comprises supposing the first $L_1$ optimal flipping thresholds are $d_1$, the following $L_2$ are $d_2$, and the next $L_3$ are $d_3$, . . . , then for the L-add-OSS, the first $L_1+L$ optimal flipping thresholds are $d_1$, the following $L_2+L$ are $d_2$ and the next $L_3+L$ are $d_3$, . . . .

7. The method of claim 1, wherein encoded messages for said channel inputs comprise multilevel encoding responsive to said computing and performing steps to include partitioning n mapping of bits into m non-overlapping subsets, and employing different rate codes for the mapping bits in different subsets.

8. The method of claim 7, wherein said different rate codes are responsive to one of parallel independent decoding PID and multistage decoding MSD.

9. The method of claim 7, wherein said multilevel encoding comprises optimizing profiles of component codes given a channel signal to noise relationship and allocating rates and optimizing said profiles for component codes responsive to an overall code rate.

10. The method of claim 7, wherein said multilevel encoding comprises given said channel input signal with a noise ratio of $E_s/N_0$, for $1 \leq i \leq m$, we evaluate error rates $e^{(i)}$ for signals $S^{(i)}$, and perform a rate optimization for a code $C^{(i)}$ by the code rate optimization; letting $R_{PID}(E_s/N_0)$ be an average rate of the component codes and given an overall code rate r, component codes $C^{(i)}$ for $1 \leq i \leq m$ being selected using a bisection search.

11. The method of claim 10, wherein said bisection search starting with a selection of said $E_S/N_0$ selection from a low value $(E_s/N_0)_l$, and a high value $(E_s/N_0)_h$, then letting $(E_s/N_0)_m = ((E_s/N_0)_h + (E_s/N_0)_l)/2$, and computing said $R_{PID}((E_s/N_0)_m)$; if said $R_{PID}((E_s/N_0)_m) < r$, then update $(E_s/N_0)_l = (E_s/N_0)_m$; otherwise update $(E_s/N_0)_h = (E_s/N_0)_m$, until $R_{PID}((E_s/N_0)_m)$ is sufficiently close to r; and assuming $(E_s/N_0)_m = (E_s/N_0)^*$ when the bisection search terminates, output $(E_s/N_0)^*$ as the threshold and the optimized profiles of component codes for $(E_s/N_0)^*$ as the designed code profiles.

* * * * *